United States Patent [19]

Finnila et al.

[11] 4,190,851

[45] Feb. 26, 1980

[54] MONOLITHIC EXTRINSIC SILICON INFRARED DETECTORS WITH CHARGE COUPLED DEVICE READOUT

[75] Inventors: Ronald M. Finnila, Costa Mesa; Stephen C. Su, Huntington Beach, both of Calif.

[73] Assignee: Hughes Aircraft Company, Culver City, Calif.

[21] Appl. No.: 614,277

[22] Filed: Sep. 17, 1975

[51] Int. Cl.² .................. H01L 27/14; H01L 31/00
[52] U.S. Cl. ........................... 357/30; 307/304; 307/311; 357/24; 250/338; 250/340
[58] Field of Search ............... 357/24, 30; 307/304, 307/311; 250/332, 334, 338, 340

[56] References Cited

U.S. PATENT DOCUMENTS

| | | | |
|---|---|---|---|
| 3,771,149 | 11/1973 | Collins et al. | 357/24 |
| 3,808,435 | 4/1974 | Bate et al. | 357/24 |
| 3,845,295 | 10/1974 | Williams et al. | 357/24 |
| 3,849,651 | 11/1974 | Ennulat | 357/24 |
| 3,883,437 | 5/1975 | Nummedal et al. | 357/24 |
| 3,896,474 | 7/1975 | Amelio et al. | 357/24 |
| 3,896,485 | 7/1975 | Early | 357/24 |
| 3,902,066 | 8/1975 | Roosild et al. | 357/24 |

*Primary Examiner*—S. C. Buczinski
*Attorney, Agent, or Firm*—G. Tacticos; W. H. MacAllister

[57] ABSTRACT

There is disclosed an all silicon monolithic focal plane array of infrared detectors for image detection. The structure comprises an epitaxial layer grown from an extrinsicly doped silicon substrate. The detectors are formed in and extend through the substrate the material of which is sensitive to specific wavelength infrared signals according to the dopant used in the substrate. The signal readout function is performed by a charge coupled device shift register constructed in the epitaxial layer by separating electrodes from it in an insulating layer formed on it. Carriers generated in the detecor by incident infrared radiation are directly injected into the CCD shift register and detected at the output end. The monolithic construction and the use of an epitaxial layer to form the CCD shift register results in low cost, high yield and high efficiency devices.

10 Claims, 6 Drawing Figures

4,190,851

MONOLITHIC EXTRINSIC SILICON INFRARED DETECTORS WITH CHARGE COUPLED DEVICE READOUT

RELATED APPLICATION

The device disclosed herein may include, but does not require, circuitry for removing the DC component of background representing charge of the type disclosed in our copending application Ser. No. 601,124 filed July 31, 1975 now Pat. No. 3,969,634, and entitled "Bucket Background Subtraction Circuit For Charge Coupled Devices" which is assigned to the same assignee as is the present application. The bucket background subtraction circuit is hereinafter referred to as "BBS."

BACKGROUND OF THE INVENTION

The present invention relates generally to imagers having a focal plane array of infrared detectors and charge coupled device signal processing circuitry associated with the detectors to transfer the signals produced by the detectors into data processing apparatus where the image may be reconstructed from the signals in a manner determined by the particular mode of scanning employed. Imagers of this general type are disclosed, for example, in the following U.S. Pat. Nos.: P. K. Weimer, 3,683,193; Y. Takemura, 3,777,061; D. R. Collins, 3,771,149; and K. Nummedal, 3,883,437. In the prior art, of which the foregoing patents are typical, efforts to integrate the photodetectors of such an array with the charge coupled circuitry have in the past led either to hybrid devices wherein the detectors were mounted on top of a separate semiconductor substrate in which the charge coupled circuitry was contained or to an arrangement wherein the photodetectors were formed as portions of the same semiconductor substrate in which the charge coupled circuitry was formed. Neither of these arrangements is optimum for the low cost, high yield and high efficiency devices which are contemplated by the present invention.

SUMMARY OF THE INVENTION

Accordingly, it is an object of the present invention to provide a monolithic IR detector array having direct injection charge coupled readout circuitry wherein a line or row of detectors is formed each extending between the opposite sides of the semiconductor substrate and wherein the charge coupled circuitry is formed in an epitaxial layer grown on one surface of the same substrate. The expitaxial layer is grown from an extrinsically doped silicon substrate which is sensitive to the specific wavelength IR signals intended to be received according to the dopant used in the substrate. An insulating layer and a radiation shielding layer are formed above the epitaxial layer in which the potential wells of the charge coupled device are formed by electrodes separated from it by at least a portion of the insulating layer. Apertures in the insulating layer and the epitaxial layer permit infrared radiation to impinge on the individual detectors producing charges which are read out by direct injection into the charge coupled device (hereinafter CCD) which functions to transfer charge through the epitaxial layer which may be n-type doped by phosphorus or arsenic where a p-type gallium doped silicon substrate is used. Under low temperature, (4° K.–20° K.) the carriers in the substrate are frozen out in the dopant level. Hence, incoming infrared signals with wavelengths such that the incident energy is equal to or greater than the ionization energy of the dopant level will generate carriers in the detector region. These generated carriers are injected into the CCD shift register formed in the epitaxial layer and are detected at the output end thereof. Such devices are of particular interest in the infrared wavelength ranges of 3–5 micrometers and 8–15 micrometers for aircraft or missile tracking systems and the like.

BRIEF DESCRIPTION OF THE DRAWINGS

The above and other objects, features and advantages will be more apparent from the detailed description below taken in conjunction with the accompanying drawings wherein like reference characters refer to like parts throughout and in which.

DETAILED DESCRIPTION OF THE INVENTION

A charge coupled device readout of a monolithic focal plane linear array of extrinsic gallium doped silicon detectors may be accomplished in accordance with the present invention which provides both the infrared detectors and their signal processing circuitries on the same semiconductor substrate, the detectors extending through the substrate and the CCD circuitry being formed in an epitaxial layer thereon. The linear array is used with an optical scanner or is moved in any convenient manner relative to the scene to be imaged.

Figure 1:
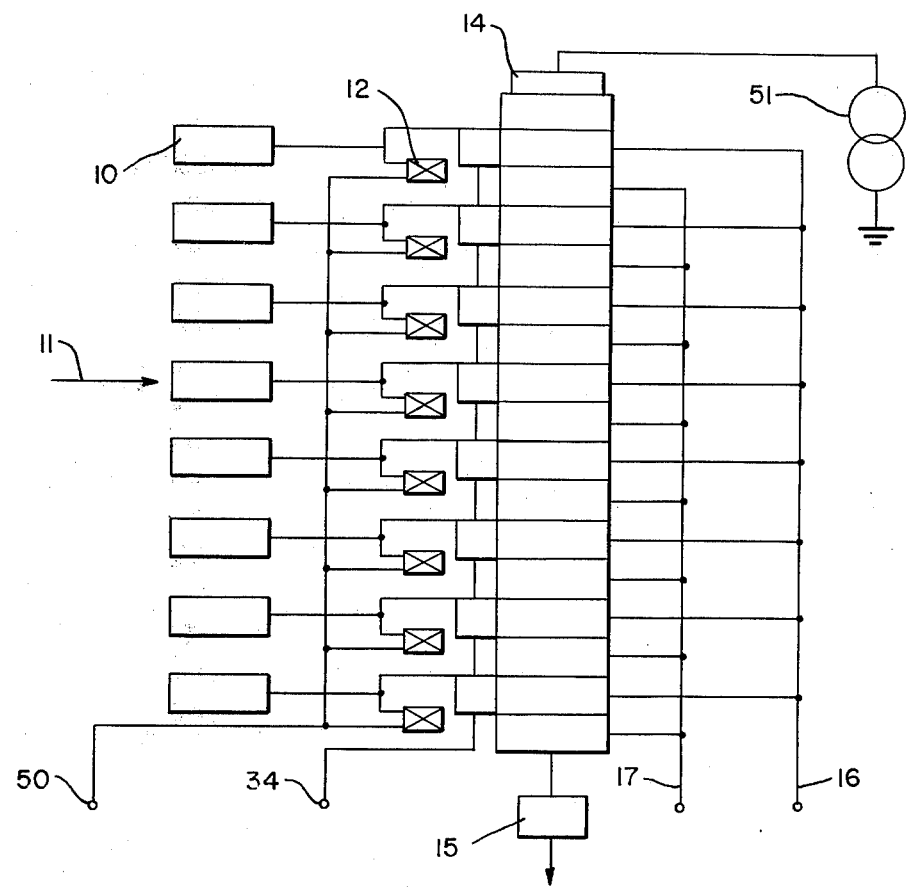
FIG. 1 is a block diagram of one embodiment the CCD imager which does not include a BBS circuit.
Figure 3:
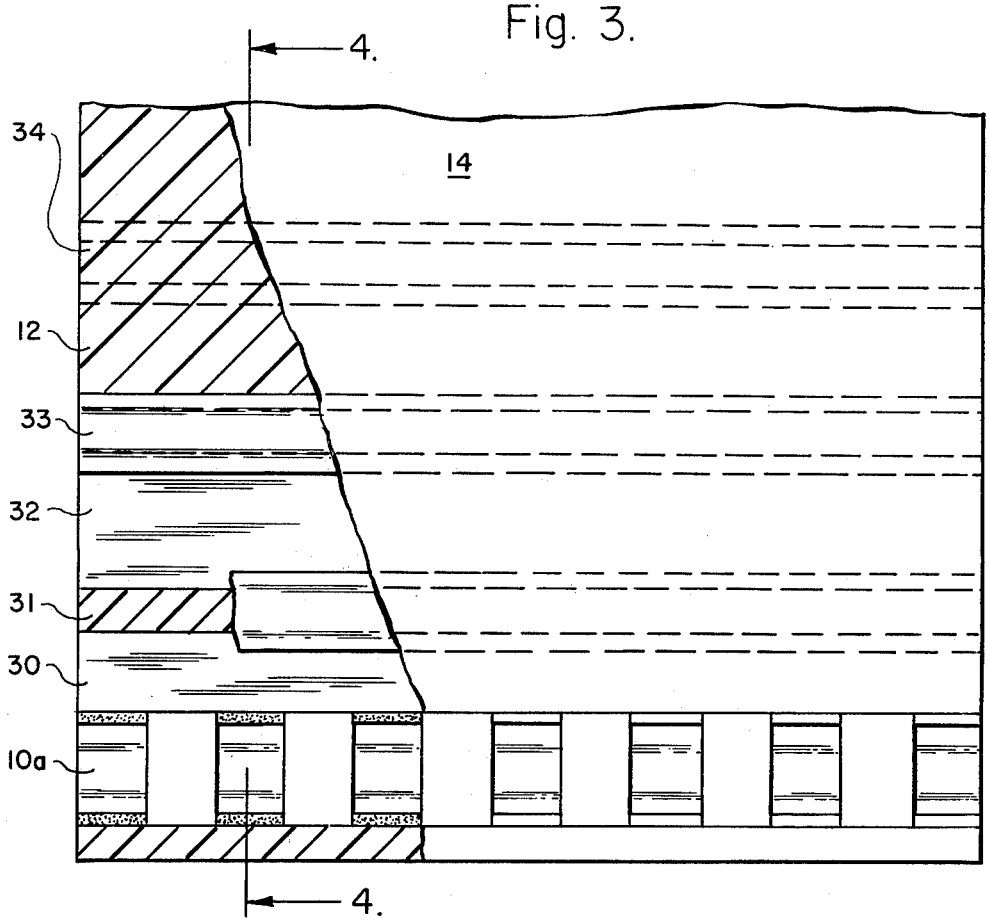
FIG. 3 is a diagrammatic plan view of the layout of a semiconductor wafer embodying the circuitry of the present invention as shown in FIG. 1 and also including bucket background subtraction circuitry (BBS)
Figure 4:
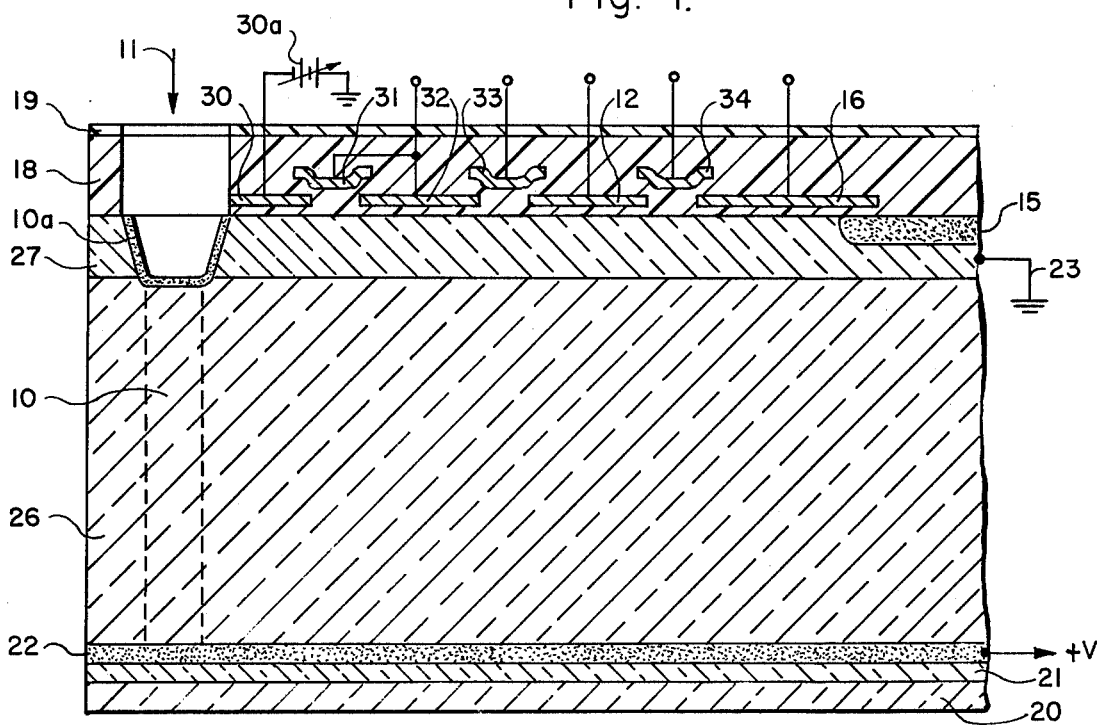
FIG. 4 is a sectional view on the line 4—4 of FIG. 3.
Figure 5:
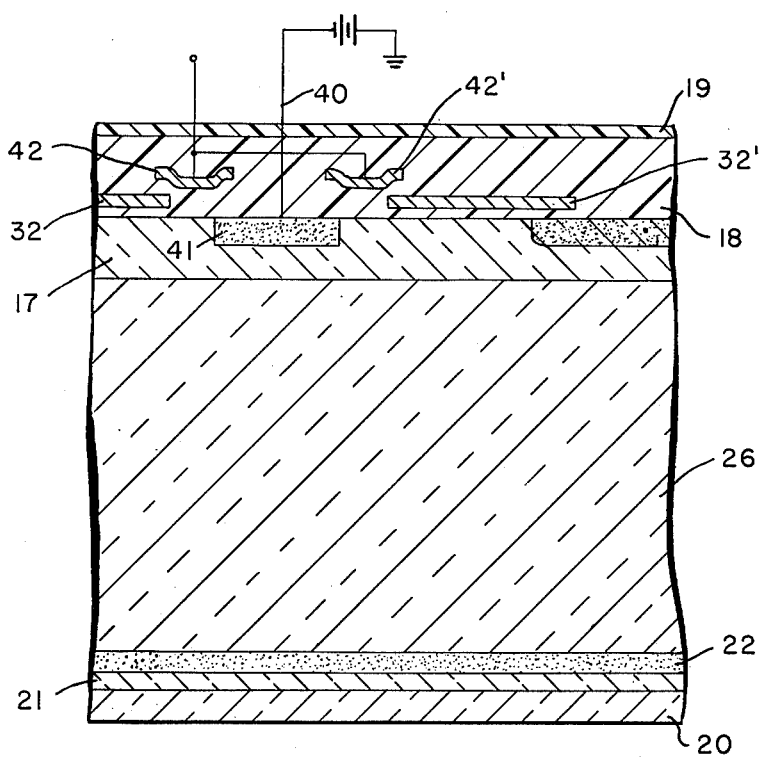
FIG. 5 is a sectional view on the line 5—5 of FIG. 3.

In one exemplary embodiment, a block diagram of which is shown in FIG. 1, and the physical embodiment of which is included in the device of FIGS. 3, 4 and 5, a thin film metallization fan-in connects an 8-element detector array to the charge coupled device inputs. The active detector area 10 of each of the detectors in this example was 7 by 12 mils square. Infrared radiation indicated by arrow 11 falls on the detectors 10 and the photon generated current therefrom is integrated and stored under a storage electrode 12 there being one such storage electrode 12 associated with each detector 10. Each detector output charge is transferred to the main channel shift register 14 when its associated transfer gate potential applied to electrode 34 is pulsed negative and is then transferred along an overlapping aluminum-polysilicon gate CCD register to an MOS output/reset circuit 15.

A blooming overload protection drain circuit 50 of a type well known in the art may in practice be provided if desired in either embodiment. A so-called "fat zero"

current to provide continuous minimum charge to register 14 is supplied from source 51.

Figure 6:
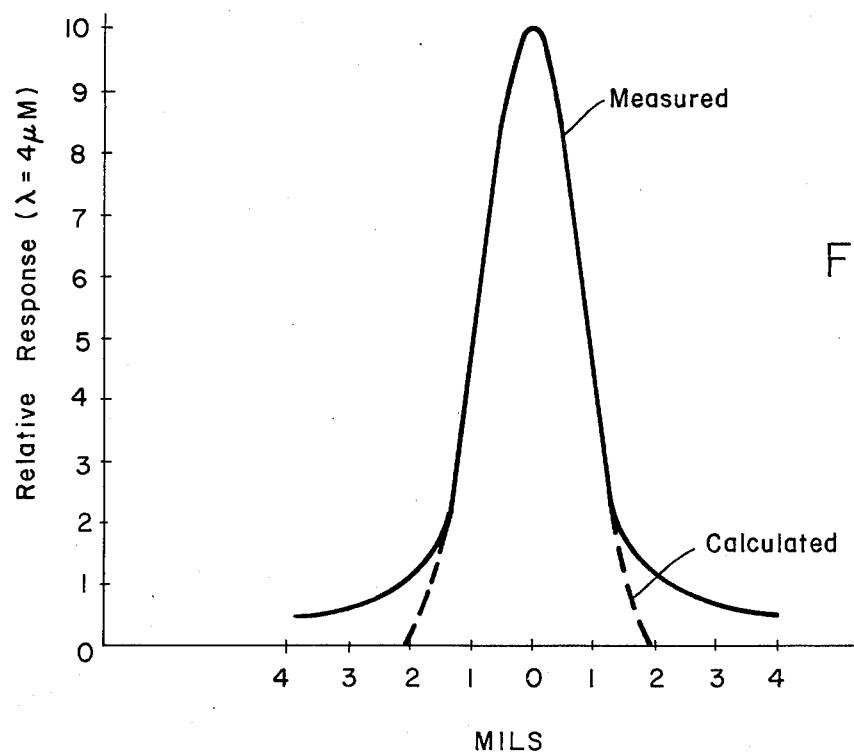
FIG. 6 is a graph showing the measured relative response of the device of FIG. 1 at a wavelength of 4 micrometers plotted as a function of the distance in millimeters from the center of a given detector in response to a scan spot.

The extrinsic silicon test device described above as an example, was fabricated on a substrate 26 doped with $3 \times 10^{16}$ gallium atoms per cubic centimeter. The 8-element gallium doped monolithic focal point array was packaged and mounted on a liquid hellium cooled finger in an evacuated metal dewar. A heater and temperature sensor mounted on the chip package permitted the operating temperature to be controlled between 6° K. and 30° K. A long metal shield cooled by liquid helium had an aperture that limited background photon flux. A narrow band spectral filter centered at 14.5 micrometer rejected visible and shortwave photons. Under these conditions measurements of signal and noise indicated satisfactory operation of such a device operated in accordance with the teaching herein and fabricated in accordance with the detailed structure shown in FIGS. 3, 4 and 5. In FIG. 6 there is shown a plot of the measured detector response and the calculated detector relative response as a function of distance from a detector center.

Figure 2:
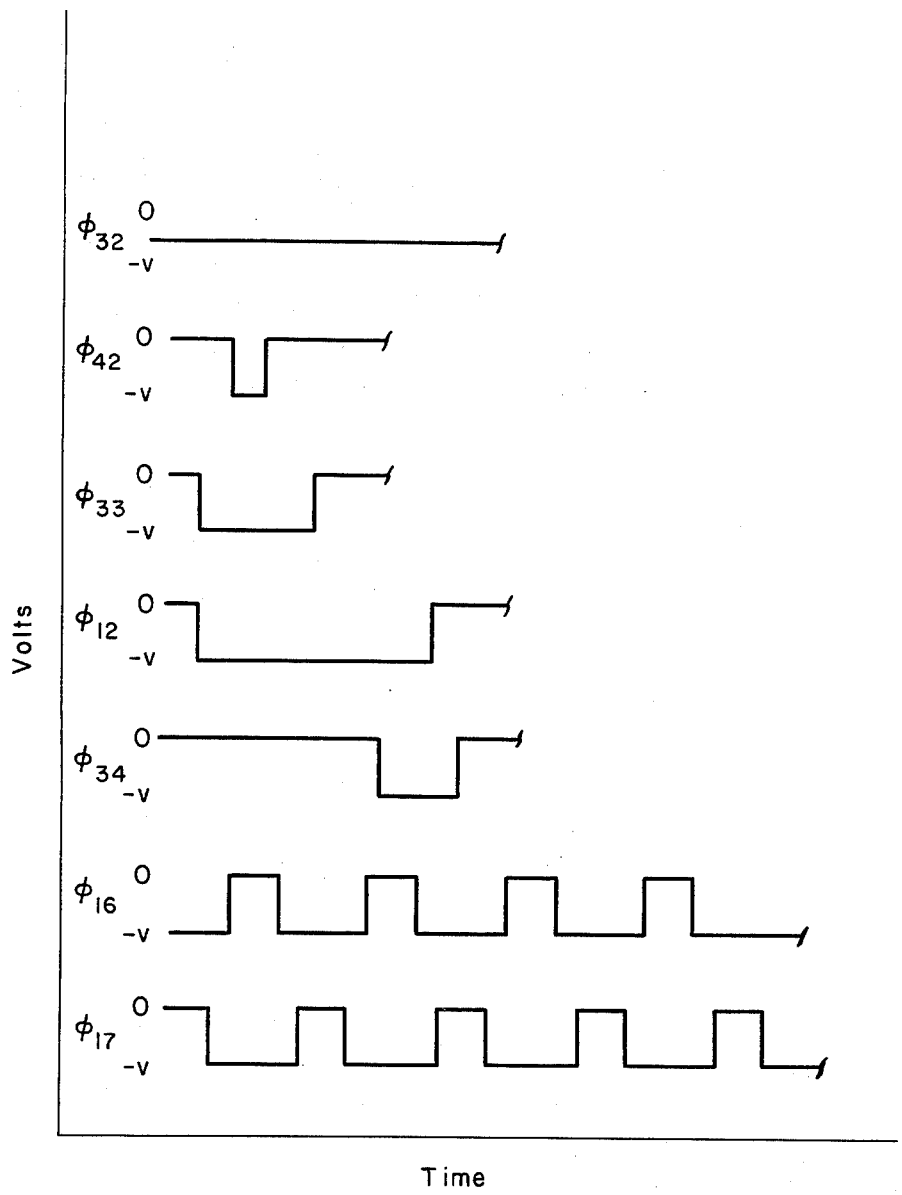
FIG. 2 is a set of waveform diagrams of the CCD drive voltages used in both the embodiment of FIG. 1 and the embodiment of FIGS. 3–5.

The operation of the device shown in FIG. 1 is controlled by the application to it of certain of the voltage waveforms graphically depicted in FIG. 2. The waveform $\phi_{16}$ is applied to the conductor 16 which is connected to alternate electrodes in the CCD 14 and the waveform $\phi_{17}$ is applied to conductor 17 which is applied to the remaining set of alternate electrodes in the CCD shift register 14. The two waveforms act as a clock to serially transfer charge received from the detectors in parallel through the register in a manner well understood in the art. All of the voltage waveforms in FIG. 2 are shown broken in order to facilitate illustration of their relative timing in operating the device. In practice the frequency of waveforms $\phi_{16}$ and $\phi_{17}$ in both embodiments could be about 10 times the frequency of the other drive voltages. For example, $\phi_{16}$ and $\phi_{17}$ may be 10 kilohertz and all other voltages 1 kilohertz, each having the relative shape illustrated in the single cycle shown for the others. In FIG. 1 charge transferred from the detector 10 to storage well 12 is again transferred to shift register 14 by application of voltage $\phi_{34}$ to electrode 34 which is connected to a transfer gate electrode 34 in each detector-to-register circuit as seen in FIG. 4. Charge is thus read into the register 14 in parallel and is read out of the register in series by application of the voltages $\phi_{16}$ and $\phi_{17}$ to electrodes 16 and 17 as described above. The addition of the BBS circuitry to this basic device affords protection against charge overload in a high IR background environment in a manner more fully explained in our above copending application, but is not otherwise necessary to the operation of the basic device.

A detailed structural showing of a device including all of the circuitry of FIG. 1 plus a "bucket background subtraction circuit" of the type shown in our above referenced application may be seen in FIGS. 3, 4 and 5. FIG. 3 is a fragmentary plan view of a semiconductor chip embodying the circuits of the present invention the figure being partially broken away to reveal buried electrodes and to illustrate the general layout of the monolithic focal plane array. FIG. 4 is a sectional view on a line 4—4 through one of the detectors 10. It will be seen that each of the detectors is formed in a semiconductor substrate 26 and extends entirely through it. In the exemplary device the substrate 26 was extrinsic silicon doped with gallium ions to a concentration of, for example, $3 \times 10^{16}$ per cubic centimeter. Formed on the substrate 26 is an epitaxial layer 27 of n-type silicon through which apertures are formed to the detector element 10 which has a p+ diffused layer 10a formed in the detector well. Above the epitaxial layer 27 is a layer 18 of insulating material through which the detector aperture also extends. On top of the insulating layer 18 is a radiation shield 19 which is also apertured at the detector opening. The radiation shield is used to define the detector element openings and to prevent radiation from reaching any other portion of the substrate. The radiation shield can be made from an aluminum layer, but in order to minimize optical crosstalk due to reflections between the radiation shield and optical components, an absorbing material such as polyimide varnish is preferred. Optical cross talk due to reflections off the back surface of the substrate 26 could also be a problem. Therefore, an optical absorbing layer 20 is coupled to the back side of the device. This optical absorbing layer is superposed over an optical coupling layer 21 which in turn is superposed on a p+ diffused layer 22 formed in the back side of the substrate 26. Layer 22 is connected to a source of positive voltage V. The epitaxial layer 17 is connected to a ground 23.

A plurality of electrodes are disposed in the insulating layer 18 and the fields generated by the drive voltages applied to these electrodes cooperate with the epitaxial layer 17 to define the functioning of the charge coupled device readout circuitry. From each of the photodetector elements 10 a charge transfer path leads orthogonally away from the row of photodetectors to the charge coupled device shift register 14 at the rear of the chip which extends in a direction parallel to the row of photodetectors for final readout.

Taking the one of these transfer paths which is shown in section in FIG. 4 as an example, it will be seen that infrared radiation 11 enters through an aperture in the radiation shield 19, insulating layer 18 and epitaxial layer 17 to strike the layer 10a of photodetector element 10 and thereby generate a charge in detector 10. Adjacent to the photodetector 10 is a bias electrode 30 to which negative bias from battery 30a is applied. Proceeding in sequence toward the CCD shift register 14 the next electrode after the bias electrode 30 is the first transfer gate electrode 31 which is followed by the bucket background storage electrode 32. D.C. bias $\phi_{32}$ is applied to both electrodes 31 and 32. In practice these electrodes can be connected together as shown in FIG. 4. Next is the electrode 33 which is the control gate for the BBS circuit and which is followed in turn by the electrode 12 which is the signal storage electrode for the BBS circuit to which waveform $\phi_{12}$ is applied. Either waveform $\phi_{33}$ or an adjustable D.C. bias may be applied to electrode 33. Electrode 12 in turn is followed by the second transfer gate 34 which is adjacent to the input electrode 16 of the CCD shift register 14 for this particular path.

The details of circuit configuration and mode of operation of the bucket background subtraction circuit which here includes the electrodes 32, 33 and 12 in FIG. 4 and all of the circuitry in FIG. 5 have been more fully set forth and explained in our copending application Ser. No. 601,124 filed July 31, 1975, and entitled "Bucket Background Subtraction Circuit For Charge Coupled Devices." From reference to that application it will be seen that the purpose of this portion of the circuitry which may optionally be used in this or other similar imaging devices is to reduce the background or DC component level of the charge signal being supplied to the shift register 14 in order to reduce the charge handling requirements imposed on the shift register and to cooperate with the antiblooming circuit 50, if any, used in the device. As is explained in the copending application, this is achieved under the control of the operating voltages $\phi_{32}$, $\phi_{12}$ and $\phi_{33}$ shown in FIG. 2 by subtracting from the background charge storage well under electrode 32 a fixed amount of charge in each cycle. In order to do this there is provided between the electrodes 32 and 32' as shown in FIG. 5 of adjacent photodetector charge flow paths a means for drawing charge off into a BBS drain 40 formed by a connection to a p+ diffusion area 41 in the epitaxial layer 17. Charge is coupled from under the storage electrode 32 to the drain system 40 and 41 under the control of drain control electrode 42 associated with the electrode 32 and electrode 42' associated with the electrode 32'. Voltage $\phi_{42}$ is applied to electrodes 42 and 42'. It will be noted that in this fashion the single drain 41 serves two adjacent charge flow paths from two adjacent photodetector elements. Of course, each pair of charge flow paths has a corresponding arrangement. The electrode 40 is connected to a negative source of voltage to drain off the charge supplied to it through the control gates 42 and 42'. An electrode (not shown) connected to blooming overload protection drain 50 may be located adjacent to each electrode 12 in a manner analogous to the location of electrode 42 and drain 41 adjacent to each electrode 32.

In the general arrangement of the monolithic focal plane array illustrated in FIGS. 3, 4 and 5, it will be noted that the detector elements 10 with the bias electrode 30 on one side thereof are biased to act as photoconductors. After a certain integration period, defined by waveform $\phi_{31}$, the charge generated in the detector fills the background charge storage potential well under electrode 32 of the BBS section through the first transfer gate 31. The signal charge then overflows the BBS storage potential barrier which is controlled by the control gate 33 and flows into the signal storage section under the electrode 12. The second transfer gate 34 will then clock the charge into the CCD shift register where it is shifted to the output end as described above in connection with FIG. 1.

In the cross-sectional showing of FIG. 4 the substrate 26 is silicon uniformly doped for operation as an extrinsic photoconductor. The epitaxial layer 27 is of n conductivity type and may be doped with phosphorus to prevent carrier freeze-out at operating temperatures. This layer is used for the CCD circuitry. The CCD is a two-phase structure operating by the voltage phases $\phi_{16}$ and $\phi_{17}$ diagrammatically shown in FIG. 2 and is fabricated with overlapping aluminum and silicon gate electrodes. In order to provide optical area definition of the detectors, the apertured radiation shield 19 is used as indicated above. This shield may be aluminum but is preferably polyimide varnish.

The operation of the device can be further understood by examining FIG. 4. The epitaxial layer 27 is connected to ground and a positive voltage is applied to the p+ layer 22 on the back of substrate 16. With the voltages shown in FIG. 2 applied to the CCD gates, the p-channel CCD transfers holes from the p+ regions, which is on the front surface of the detector element to the CCD output. The p+ region becomes negatively baised with respect to the epitaxial layer and p+ back layer. The electric field across the detector element sweeps the holes generated by radiation absorbed within the detector area into the CCD. With these polarities the operating voltage waveforms of FIG. 2 must be negative going. With reversed doping and polarities, they would, of course, be positive going.

What we claim is:

1. In an image detector of the type having at least one optical detector operable to generate an electrical charge signals in response to optical radiation, and having means for processing said signals comprising a charge coupled signal collecting device for transferring charge to a utilization circuit, the improvement comprising:

(a) a semiconductor substrate having an epitaxial layer monolithically formed thereon;
   (b) an insulating layer of dielectric material formed on said epitaxial layer;
   (c) at least one optical detector element formed in said substrate and having at least one surface accessible to optical radiation through an aperture extending through both said epitaxial layer and said insulating layer; and
   (d) a plurality of electrode means spaced from said epitaxial layer by at least a portion of said insulating layer for forming said charge coupled signal processing device in said insulating and epitaxial layers to transfer signal charge from said detector element through said epitaxial layer to said utilization circuit in response to cyclical voltages applied to said electrode means to control the potential profile in said epitaxial layer.

2. A device as in claim 1 wherein a plurality of said detector elements are formed in said substrate and positioned colinearly therein to form a line scanner and wherein a radiation shield layer of material which is opaque to said optical radiation is formed on said insulating layer, said aperture for each said detector element also extending through said radiation shield, the apertures for adjacent detectors being separated by a portion of said material of said radiation shield layer.

3. A device as in claim 2 wherein said substrate is a semiconductor doped to have a first polarity, wherein said epitaxial layer has an opposite polarity and is thin by comparison to said substrate and wherein a detector electrode layer is formed on the side of said substrate opposite from that on which said epitaxial layer is formed, said detector electrode comprising a portion of said substrate semiconductor which is more heavily doped to said first polarity, each of said detector elements extending from said detector electrode through said substrate to said aperture in said epitaxial layer.

4. A device as in claim 3 wherein said detector electrode is connected to a source of voltage of said first polarity and said epitaxial layer is connected to ground.

5. A device as in claim 3 wherein an optical coupling layer and an optical absorbing layer are formed on said detector electrode layer to prevent optical cross talk between detector elements.

6. A device as in claim 3 wherein each of said detectors has operatively associated with it a charge coupled signal collecting device which extends in said epitaxial layer in a direction orthogonal to said line scanner.

7. A device as in claim 6 wherein all of said charge coupled signal collecting devices feed charge signal in parallel into a common serially operated charge coupled shift register.

8. A device as in claim 6 wherein each of said signal collecting devices includes background subtraction circuit means for removing a uniform image background representing D.C. component from said charge signal transmitted through it.

9. An image detector including in combination:
(a) a semiconductor substrate of a first conductivity type;
(b) an epitaxial layer adjacent to said semiconductor substrate and having a second type conductivity;
(c) an optical detector region formed in at least a portion of said semiconductor substrate for generating charge in response to received radiation;
(d) conducting means of the same conductivity type as said detector region for permitting charge generated in said detector region in response to received radiation to move from said region to the upper surface of said epitaxial layer;
(e) an insulating layer of dielectric material formed on said epitaxial layer;
(f) a plurality of electrode means spaced from said epitaxial layer by at least a portion of said insulating layer for processing charge generated in said optical detector region and moving it along said epitaxial layer to a utilization circuit.

10. A device as set forth in claim 9 wherein said means for transferring charge from said optical detector region to said epitaxial layer comprise a heavily doped region of a chosen thickness and lateral extent defining an aperture in said epitaxial layer whereby incoming radiation reaches said optical detector region through said aperture in said epitaxial layer.

* * * * *